(12) United States Patent
Shigaraki

(10) Patent No.: US 7,262,830 B2
(45) Date of Patent: Aug. 28, 2007

(54) EXPOSURE APPARATUS, AND DEVICE MANUFACTURING METHOD

(75) Inventor: Toshiyuki Shigaraki, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 133 days.

(21) Appl. No.: 11/233,034

(22) Filed: Sep. 23, 2005

(65) Prior Publication Data

US 2006/0066825 A1    Mar. 30, 2006

(30) Foreign Application Priority Data

Sep. 24, 2004    (JP) ............................. 2004-277496

(51) Int. Cl.
*G03B 27/52* (2006.01)
*G03B 27/54* (2006.01)
*F21V 29/00* (2006.01)

(52) U.S. Cl. ........................ 355/30; 355/67; 362/373

(58) Field of Classification Search ................ 355/30, 355/53, 67; 362/580, 373
See application file for complete search history.

(56) References Cited

U.S. PATENT DOCUMENTS

| 4,690,528 A | * | 9/1987 | Tanimoto et al. ............ 353/101 |
| 4,704,348 A | * | 11/1987 | Koizumi et al. ............. 430/327 |
| 6,002,987 A | * | 12/1999 | Kamiya et al. ................ 702/56 |
| 6,224,248 B1 |  | 5/2001 | Chiba ........................... 362/580 |
| 2004/0182565 A1 | * | 9/2004 | Nomoto ........................ 165/275 |

FOREIGN PATENT DOCUMENTS

JP    11-329951    11/1999

* cited by examiner

*Primary Examiner*—Alan Mathews
(74) *Attorney, Agent, or Firm*—Fitzpatrick, Cella, Harper & Scinto

(57) ABSTRACT

An apparatus for exposing a wafer to light. The apparatus includes a light source unit having a light source for emitting light, a first cooling unit for cooling the light source unit, in which the first cooling unit has a gas flowpassage for a gas passing through the light source unit, a second cooling unit for cooling the gas, in which the second cooling unit has a first fluid flowpassage for a first fluid which is to be heat-exchanged with the gas in the gas flowpassage at a position downstream of the light source unit with respect to the flow of the gas, and a first temperature adjusting unit for adjusting the temperature of the first fluid. The first temperature adjusting unit has a second fluid flowpassage for a second fluid which is to be heat-exchanged with the first fluid in the first fluid flowpassage at a position upstream of the cooling unit with respect to the flow of the first fluid.

5 Claims, 5 Drawing Sheets

EXPOSURE APPARATUS, AND DEVICE MANUFACTURING METHOD

FIELD OF THE INVENTION AND RELATED ART

This invention relates to an exposure apparatus having a light source, which is also a heat generation source.

In semiconductor exposure apparatuses, precise temperature control is required to assure precise positioning. The temperature control can be carried out in various ways, such as ventilating a heat source by using a gas, precise air-conditioning based on gas circulation, removing heat from the heat source by using a liquid, and precise temperature control of an object by using a liquid. When the heat source is outside a clean area, as in the case of heat generation from a light source or an electricity rack, outside air is introduced, and the heat is exhausted, by using a blower. For temperature stabilization of the space in the clean area, a gas, such as air or nitrogen, is circulated as a temperature adjusting medium. The circulated and returned gas is heat-exchanged by using cooling water, and it is cooled to a temperature that enables temperature control. The gas so sufficiently cooled is then heated to a particular temperature by means of an electrical heater or any other re-heating system using exhaust heat, to reduce temperature fluctuation due to external disturbance. Thereafter, the gas is precisely temperature-adjusted by means of an electrical heater or a Peltier device, for example, in accordance with the temperature required individually for each portion where the temperature is to be controlled, and the gas is blown thereto.

When a cooling function unit is provided separately, as the apparatus structure is very bulky, cooling water may be used in the cooling function unit, and a secondary coolant being sufficiently cooled by means of a refrigerator or a compressor may be used. In that case, after the heat transportation, heat exchanging by using a heat exchanger may be carried out. When heat exhausting or temperature control is to be made to a liquid, the procedure is approximately the same as that in the case of a gas.

In semiconductor exposure apparatuses that use a helium lamp as a light source, a special cooling mechanism is required to avoid adverse influences of heat generated from the lamp upon the temperature control. To this end, outside air may be introduced to perform forcible ventilation, to thereby lower the temperature to and under a predetermined temperature (see, for example, Japanese Laid-Open Patent Application, Publication No. 11-329951).

However, Hg lamps currently used as a light source have a large power of more than 4 kW, and they produce a large amount of heat. If heat exhausting is carried out, the exhaust gas temperature will be 60° C. or higher. Discharging such high-temperature exhaust gas into a clean room environment would be very undesirable, since it creates a heavy burden with respect to the factory equipment.

SUMMARY OF THE INVENTION

It is accordingly an object of the present invention to provide a unique technique for cooling a light source unit.

It is another object of the present invention to provide a unique and an improved exposure apparatus and/or an exposure method by which at least one of the inconveniences described above can be removed or reduced.

In accordance with an aspect of the present invention, there is provided an apparatus for exposing a wafer to light, the apparatus comprising a light source unit having a light source for emitting light, a first cooling unit for cooling the light source unit, the first cooling unit having a gas flow-passage for a gas passing through the light source unit, and a second cooling unit for cooling the gas, the second cooling unit having a first fluid flowpassage for a first fluid, which is to be heat-exchanged with the gas in the gas flowpassage at a position downstream of the light source unit with respect to the flow of the gas.

In accordance with another aspect of the present invention, there is provided a device manufacturing method, comprising the steps of exposing a substrate to light by use of an apparatus as discussed above, developing the exposed substrate, and processing the developed substrate to produce a device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First Embodiment

Figure 1:
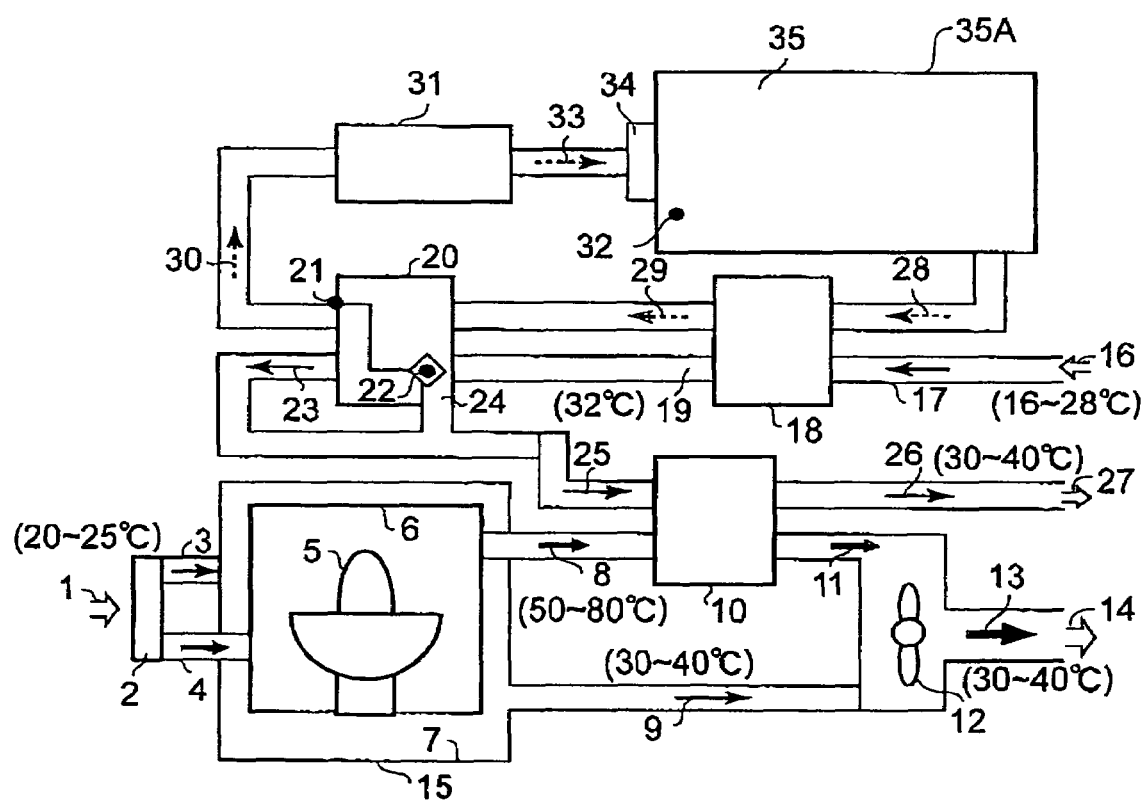
FIG. 1 is a schematic and diagrammatic view of a general structure of a heat treatment system in a semiconductor exposure apparatus according to a first embodiment of the present invention.

FIG. 1 is a schematic and diagrammatic view of a general structure of a heat treatment system in a semiconductor exposure apparatus according to a first embodiment of the present invention. Details of the heat treatment system of the semiconductor exposure apparatus according to the first embodiment of the present invention will be explained with reference to FIG. 1.

Denoted in the drawing at 1 is outside air to be introduced from the outside to the inside of the apparatus as cooling air having a temperature of about 20 to 25° C. Denoted at 2 is an air filter, and denoted at 3 and 4 are outside air introducing paths, respectively. The outside air introducing path 3 functions to introduce the outside air into a lamp box outer shell 7, while the outside air introducing path 4 serves to introduce the outside air into a lamp box inner shell 6. Denoted at 5 is an Hg lamp, which is a light source of exposure light, and the temperature thereof becomes very high. The exposure light source 5 is normally kept turned on, since it take a long time until the light quantity is stabilized after it is turned on/off. Thus, a heat exhaust gas 8 has an approximately stabilized temperature. Denoted at 6 is the lamp box inner shell, the inside thereof being at a high temperature due to heat generation from the Hg lamp 5. Denoted at 7 is the lamp box outer shell that defines a space between it and the inner shell 6, for heat exhaust of a relatively low temperature. The outside wall of the lamp box outer shell is thermally insulated by means of a heat insulating material 15, to reduce the influence of heat to the apparatus internal structure.

The heat exhaust gas 8 passing through the inside of the lamp box inner shell 6 and directed toward a heat exchanger 10 has a high temperature of about 50-80° C., and the gas cannot be discharged outwardly as it is. To meet this, in the heat exchanger 10, the gas is heat-exchanged by using ejected cooling water 25 of about 25-28° C., whereby a heat exhaust gas 11 having its temperature lowered to about 40° C. or lower is provided. On the other hand, a heat exhaust gas 9 passed through the space between the outside of the lamp box inner shell 6 and the inside of the lamp box outer shell 7 has a temperature of about 30-40° C., and thus, the gas is discharged as it is to the outside of the apparatus by means of an exhaust fan 12. Here, at the exhaust fan 12, the heat exhaust gas 9 is mixed with the heat exhaust gas 11 passed through the heat exchanger 10, whereby a heat exhaust gas 13 is provided. This heat exhaust gas 13 is discharged outwardly of the apparatus as a factory exhaust gas 14. The temperature of this heat exhaust gas 13 is about 40° C. or lower, which is a heat exhaust gas temperature appropriate to the factory exhaust gas. Ejected wafer 26 having been heat-exchanged at the heat exchanger 10 is discharged to the factory side as factory ejected water 27 of about 30-40° C.

Regarding production of the ejected cooling water 25, initially, factory cooling water 16 of about 16 to 28° C. is supplied along a cooling water path 17 and it is heat-exchanged at a temperature-controlling-medium cooling device 18, whereby ejected cooling water 19 of about 32° C. is provided. On the other hand, the temperature controlling medium 29 having been temperature-exchanged and cooled at the cooling device 18 is supplied to a cooling-water-exhaust-heat-reusing heat exchanging temperature control unit 20, where the temperature thereof is detected and controlled by using a temperature sensor 21. Hence, a temperature controlling medium 30 having been coarsely heated and temperature-controlled is provided. This temperature controlling medium 30 is thereafter heated and temperature-controlled again at a precise temperature controlling unit 31.

Denoted at 34 is a filter, and denoted at 32 is a temperature sensor for precision temperature control. The temperature controlling medium 33 having been precisely temperature-controlled is introduced into a temperature controlling chamber 35A as an injected temperature controlling medium, and it deprives a temperature control subject 35 of heat. Thereafter, it is collected as an ejected temperature controlling medium, whereby a temperature controlling medium 28 is produced. The temperature controlling medium may be a gas, such as air or nitrogen, for example, or a liquid, such as pure water, antifreeze liquid, or freon (Freon) series insulative liquid (cooling oil), for example. For coarse heating of the temperature controlling medium at the cooling-water-exhaust-heat-reusing heat exchanging temperature control unit 20, the ejected cooling water 19 of 32° C. may be used to perform the heat exchange, while controlling a control valve 22 on the basis of a detected value of the temperature sensor 21. The ejected cooling water 23 having been cooled by the heat exchange and the bypassed ejected cooling water 24 are combined into ejected cooling water 25 of about 25 to 28° C., which is then heat-exchanged at the heat exchanger 10 with the high-temperature heat exhaust gas 8 inside the lamp box.

Second Embodiment

Figure 2:
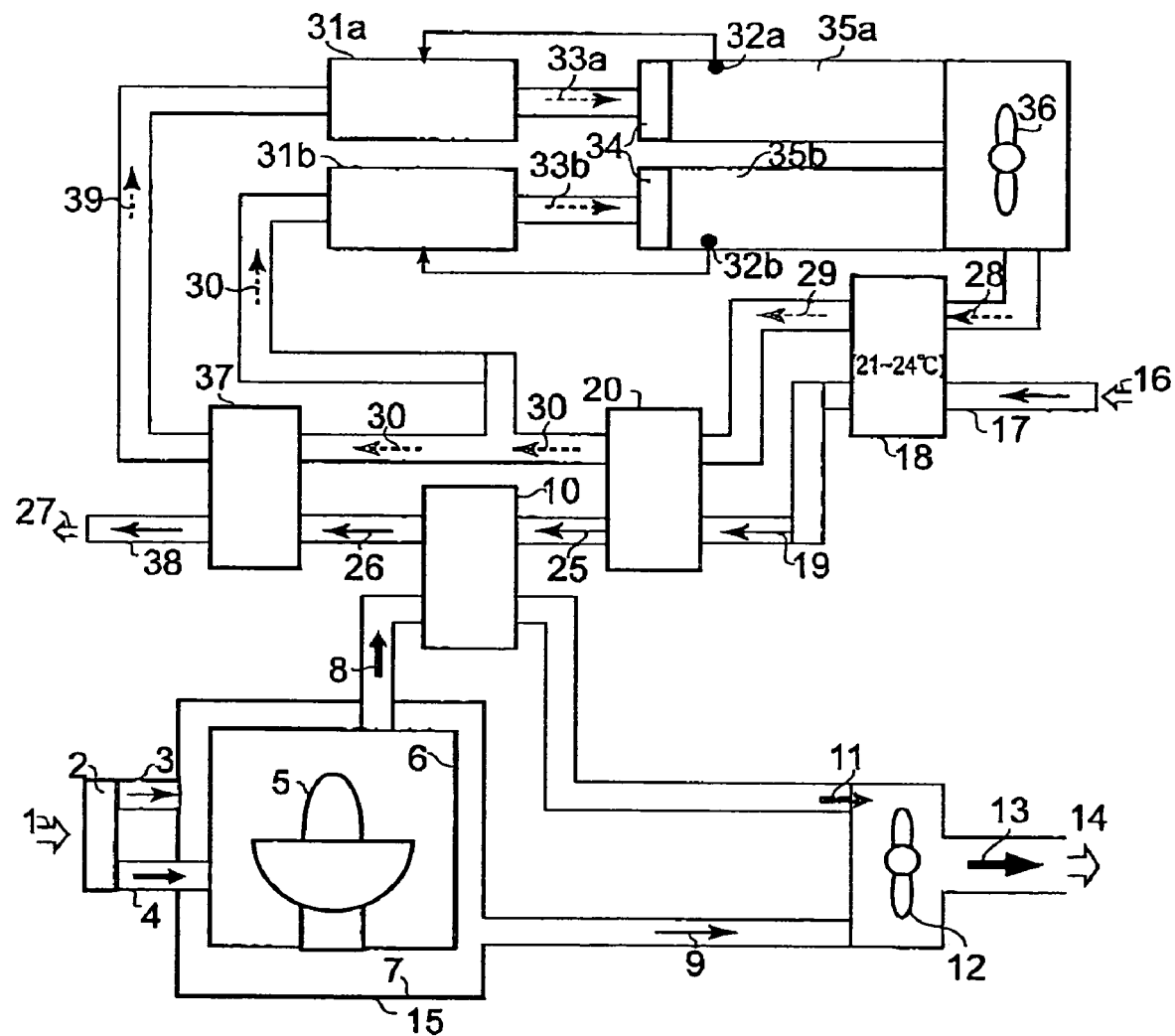
FIG. 2 is a schematic and diagrammatic view of a general structure of a heat treatment system in a semiconductor exposure apparatus according to a second embodiment of the present invention.

FIG. 2 is a schematic and diagrammatic view of a general structure of a heat treatment system in a semiconductor exposure apparatus according to a second embodiment of the present invention. Details of the heat treatment system of the semiconductor exposure apparatus according to the second embodiment of the present invention will be explained with reference to FIG. 2.

In accordance with the embodiment shown in FIG. 2, in addition to the first embodiment, there is a second coarse heating unit 37. The second coarse heating unit 37 uses the ejected water having been heat-exchanged at the heat exchanger 10 to coarsely heat again a portion of the temperature controlling medium 30, having been coarsely heated and temperature-controlled. As a result of this, a temperature controlling medium 39, having been coarsely reheated and having a temperature higher than the temperature controlling medium 30, is produced.

Subsequently, the temperature controlling media 30 and 39 are precisely temperature-controlled at precision temperature control units 31b and 31a, respectively and individually, and then they are used to temperature-control the subjects 35b and 35a of temperature control, respectively and individually. After this, the temperature controlling media are collected by means of a circulation fan 36 (if air is used) or a circulation pump 36 (if liquid is used), whereby collected temperature controlling medium 28 is provided. The factory ejected water 27 is discharged outwardly through an ejected water path 38.

Third Embodiment

Figure 3:
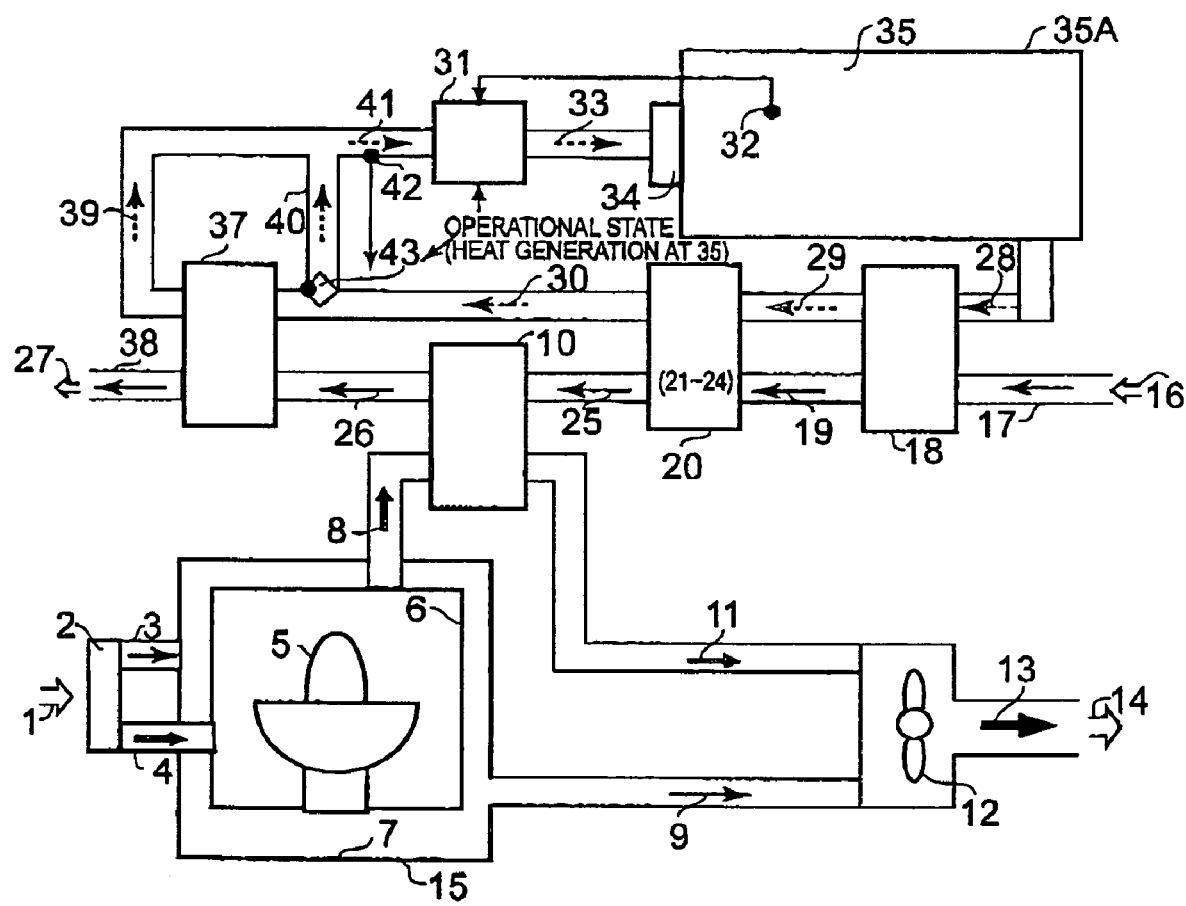
FIG. 3 is a schematic and diagrammatic view of a general structure of a heat treatment system in a semiconductor exposure apparatus according to a third embodiment of the present invention.

FIG. 3 is a schematic and diagrammatic view of a general structure of a heat treatment system in a semiconductor exposure apparatus according to a third embodiment of the present invention. Details of the heat treatment system of the semiconductor exposure apparatus according to the third embodiment of the present invention will be explained with reference to FIG. 3.

In the third embodiment shown in FIG. 3, the temperature controlling medium 39 coarsely reheated in the structure of the second embodiment and the branched temperature controlling medium 30 are mixed with each other by means of the provision of a bypass 40. The mixture of the temperature controlling medium 39 and the temperature controlling medium 30 provides a temperature controlling medium 41. Here, the temperature of the temperature controlling medium 41 is measured by use of a temperature sensor 42, so that the degree of opening of a two-way control valve (or three-way control valve) 43 is adjusted in accordance with the state of heat generation at the temperature-control subject 35 to perform coarse temperature adjustment.

Subsequently, the coarsely temperature-controlled temperature-controlling medium 41 is supplied to a precision temperature control unit 31, where most appropriate temperature control is carried out to the temperature controlling medium 41 in accordance with the measurement by the temperature sensor 32 and the state of heat generation at the temperature control subject 35. Then, the temperature controlling medium is used to control the temperature of the temperature control subject 35.

Fourth Embodiment

Figure 4:
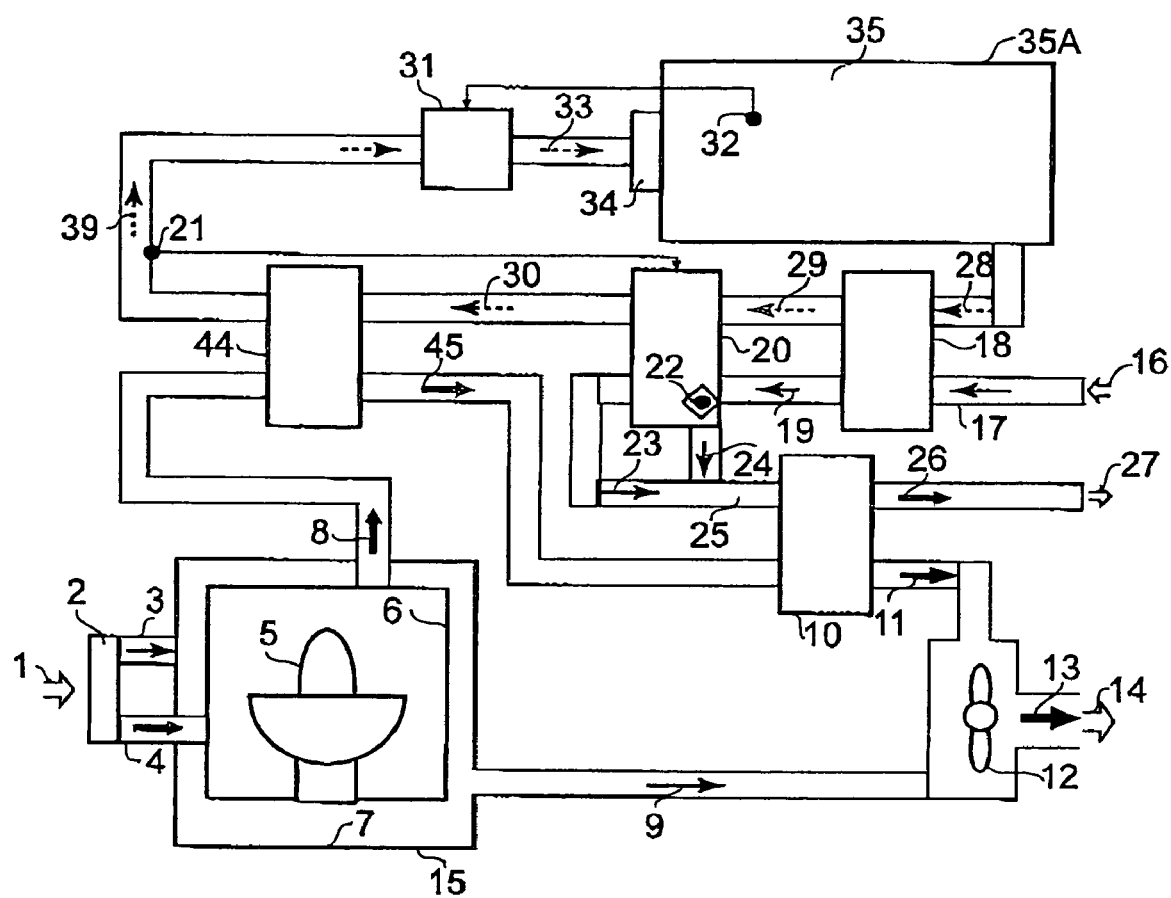
FIG. 4 is a schematic and diagrammatic view of a general structure of a heat treatment system in a semiconductor exposure apparatus according to a fourth embodiment of the present invention.

FIG. 4 is a schematic and diagrammatic view of a general structure of a heat treatment system in a semiconductor exposure apparatus according to a fourth embodiment of the present invention. Details of the heat treatment system of the semiconductor exposure apparatus according to the fourth embodiment of the present invention will be explained with reference to FIG. 4.

In the fourth embodiment shown in FIG. 4, before it is heat-exchanged at the heat exchanger 10, the high-temperature heat exhaust gas 8 inside the lamp box is heat-exchanged at a heat exchanger 44 by a coarsely-heated temperature controlling medium 30 whereby a high-temperature exhaust gas 45 is provided. At the cooling-water-exhaust-heat-reusing heat exchanging temperature control unit 20, the temperature of the temperature controlling medium 39 having been reheated by the heat exchanger 44 is measured by use of a temperature sensor 21. By adjusting the degree of opening of a two-way control valve (or three-way control valve) 22 on the basis of the temperature measurement, coarse-heating temperature control is performed so that the temperature of the temperature controlling medium 30 is held constant.

Fifth Embodiment

Next, as a fifth embodiment, an embodiment of a semiconductor device manufacturing method, which uses an exposure apparatus having a heat treatment system according to any one of the first to fourth embodiments described above, will be explained.

Figure 5:
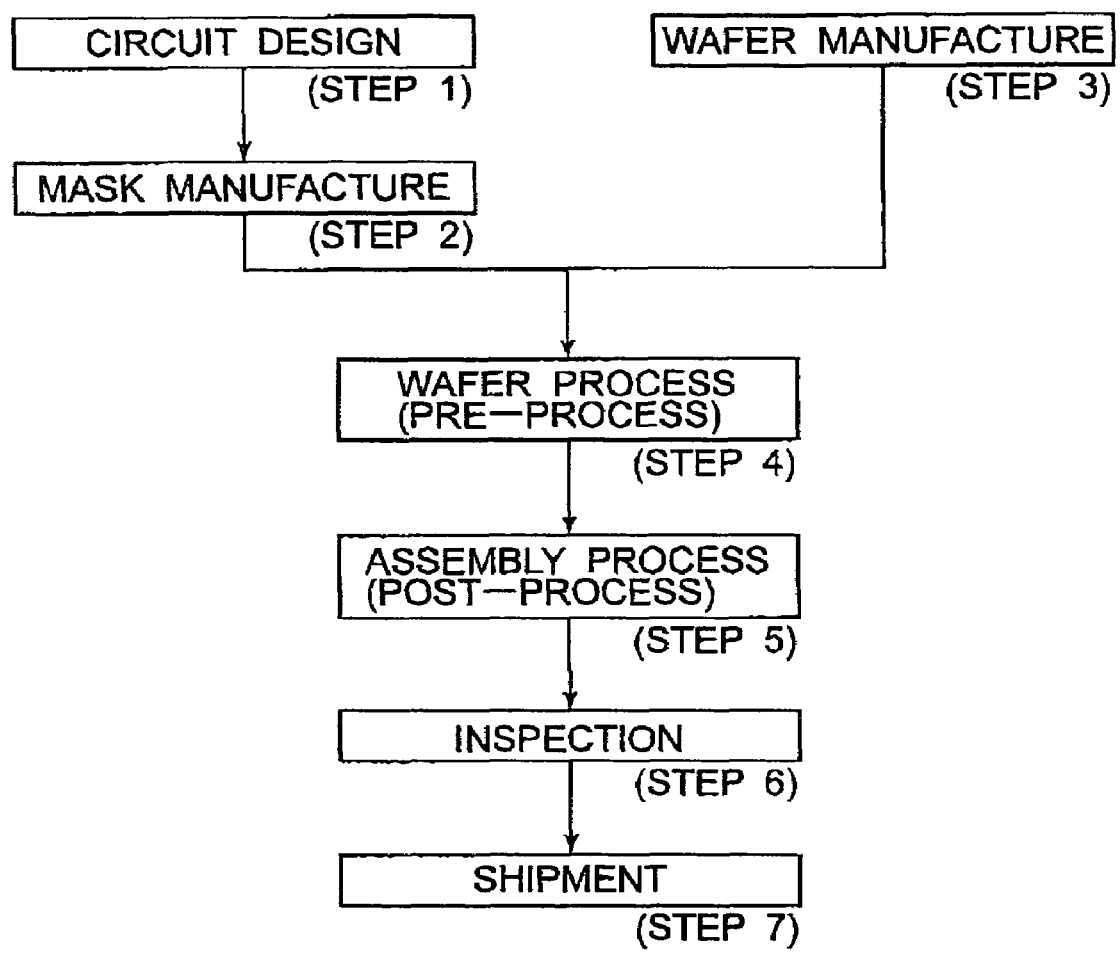
FIG. 5 is a flow chart for explaining a general procedure of semiconductor device manufacture.

FIG. 5 is a flow chart for explaining the overall procedure for semiconductor manufacture. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging chip (chip sealing) process. Step 6 is an inspection step wherein an operation check, a durability check, and so on, for the semiconductor devices produced by step 5, are carried out. With these processes, semiconductor devices are produced, and they are shipped (step 7).

More specifically, the wafer process at step 4 described above includes (i) an oxidation process for oxidizing the surface of a wafer, (ii) a CVD process for forming an insulating film in the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

In accordance with the embodiments of the present invention as described hereinbefore, the temperature of the high-temperature exhaust gas is lowered and the exhaust heat is released to the cooling water. As a result of this, the exhaust gas temperature becomes close to the normal temperature. This makes the burden on factory equipment smaller, and it reduces the influence on the clean room temperature.

Furthermore, in the embodiments described above, the coarse heating function for performing precise temperature control is provided by use of heat generation of the exposure light source and without the use of heating means, such as a heater. The electricity power consumption of the apparatus can be reduced, which saves energy.

Moreover, in the embodiments described hereinbefore, in addition to the advantageous features mentioned above, through the precision improvement of coarse heating temperature control, the cost of the apparatus can be reduced significantly.

While the invention has been described with reference to the structures disclosed herein, it is not confined to the details set forth and this application is intended to cover such modifications or changes as may come within the purposes of the improvements of the scope of the following claims.

This application claims priority from Japanese Patent Application No. 2004-277496, filed Sep. 24, 2004, which is hereby incorporated by reference.

What is claimed is:

1. An apparatus for exposing a wafer to light, said apparatus comprising:
    a light source unit having a light source for emitting light;
    a first cooling unit for cooling said light source unit, said first cooling unit having a gas flowpassage for a gas passing through said light source unit;
    a second cooling unit for cooling the gas, said second cooling unit having a first fluid flowpassage for a first fluid which is to be heat-exchanged with the gas in the gas flowpassage at a position downstream of said light source unit with respect to the flow of the gas; and
    a first temperature adjusting unit for adjusting the temperature of the first fluid said first temperature adjusting unit having a second fluid flowpassage for a second fluid which is to be heat-exchanged with the first fluid in the first fluid flowpassage at a position upstream of said cooling unit with respect to the flow of the first fluid.

2. An apparatus according to claim 1, further comprising a second temperature adjusting unit for adjusting the temperature of the second fluid in the second fluid flowpassage, which is to be heat-exchanged with an object inside said apparatus, at a position downstream of said first temperature adjusting unit with respect to the flow of the second fluid.

3. An apparatus according to claim 2, wherein said apparatus comprises a plurality of second temperature adjusting units.

4. An apparatus according to claim 1, wherein said apparatus comprises a plurality of second cooling units.

5. A device manufacturing method, comprising the steps of:
    exposing a substrate to light by use of an apparatus as recited in claim 1;
    developing the exposed substrate; and
    processing the developed substrate to produce a device.

* * * * *

UNITED STATES PATENT AND TRADEMARK OFFICE
CERTIFICATE OF CORRECTION

| | | |
|---|---|---|
| PATENT NO. | : 7,262,830 B2 | Page 1 of 1 |
| APPLICATION NO. | : 11/233034 | |
| DATED | : August 28, 2007 | |
| INVENTOR(S) | : Toshiyuki Shigaraki | |

It is certified that error appears in the above-identified patent and that said Letters Patent is hereby corrected as shown below:

<u>COLUMN 6:</u>
      Line 43, "fluid" should read -- fluid, --.

Signed and Sealed this

Twenty Second Day of April, 2008

JON W. DUDAS
*Director of the United States Patent and Trademark Office*